United States Patent [19] [11] 3,900,352
Potter [45] Aug. 12, 1975

[54] ISOLATED FIXED AND VARIABLE THRESHOLD FIELD EFFECT TRANSISTOR FABRICATION TECHNIQUE

[75] Inventor: Michael David Potter, Grand Isle, Vt.

[73] Assignee: International Business Machines Corporation, Armonk, N.Y.

[22] Filed: Nov. 1, 1973

[21] Appl. No.: 411,857

[52] U.S. Cl. .................. 148/187; 148/188
[51] Int. Cl.² .................. H01L 21/223
[58] Field of Search .................. 148/187, 188

[56] References Cited

UNITED STATES PATENTS

| | | | |
|---|---|---|---|
| 3,479,237 | 11/1969 | Bergh et al. | 148/187 X |
| 3,673,679 | 7/1972 | Carbajal et al. | 148/188 X |
| 3,682,724 | 8/1972 | Bohannon, Jr. | 148/187 X |

OTHER PUBLICATIONS

Dhaka et al., "Masking Technique," IBM Tech. Discl. Bull., Vol. 11, No. 7, Dec. 1968, pp. 864, 865.
Sarace et al., "Metal–Nitride–Oxide–Silicon FETs with Self–Aligned Gates," Solid–State Electronics, Vol. 11, 1968, pp. 653–660.

*Primary Examiner*—L. Dewayne Rutledge
*Assistant Examiner*—J. M. Davis
*Attorney, Agent, or Firm*—Francis J. Thornton

[57] ABSTRACT

This describes a process for producing both fixed and variable threshold devices in a single semi-conductor array without critical alignment of masks especially between sequential etching and diffusion steps. This process uses a series of insulating layers on a semiconductor body, each layer being etched by a process different from that required to attach any adjacent contiguous layer, a masking operation to initially define all the devices to be ultimately created and applying a series of coatings to permit the sequential selective forming of both fixed and variable threshold devices in the array.

In essence, this invention teaches that multi-level dielectrics having different etching characteristics can be used in a manner such that the first of the layers will have produced therein all the subsequent steps and devices to be produced in the underlying body and will serve to limit the subsequent etching and/or diffusion steps.

10 Claims, 11 Drawing Figures

ISOLATED FIXED AND VARIABLE THRESHOLD FIELD EFFECT TRANSISTOR FABRICATION TECHNIQUE

BACKGROUND OF THE INVENTION

1. Field of the Invention

This invention relates generally to a method of fabrication of semiconductor structures and more particularly to the fabrication of an integrated semiconductor array which includes both fixed and variable threshold field effect transistors.

2. Description of the Prior Art

Fixed threshold field effect transistors and methods of fabricating them are well known to the prior art. Also, it is known that such devices can be made using multiple layers of insulating materials requiring multiple masking steps. Typical of these processes is U.S. Pat. No. 3,342,650.

Variable threshold field effect transistors using trapped charges and an insulator overlying the channel of an insulating gate FET are also known and various structures and methods have been proposed for such devices. U.S. Pat. No. 3,590,272 is typical of such solid state memory elements which utilize dual dielectric materials to store charge and thus vary the threshold level of the underlying gate region.

In as much as the present invention relates especially to methods and processes for fabricating field effect transistors it is appropriate to mention that processes of producing either fixed threshold or variable threshold devices are known in the art. For example, U.S. Pat. No. 3,475,234 teaches that self-aligned gate structures can be produced to provide fixed threshold field effect transistors without critical alignment of masks between sequential etch and diffusion steps. U.S. Pat. Nos. 3,477,866 and 3,585,089, and 3,615,940 and IBM Technical Disclosure Bulletin Vol 14 No. 2, July 1971, p. 387, all generally teach that layers of different insulating materials can serve as sequential etching masks for respective underlying layers of insulating materials. U.S. Pat. No. 3,542,551 further teaches using photo masks and photoresist layers with a partial etching technique through a very thick layer of silicon dioxide. An article appearing in the IBM Technical Disclosure Bulletin, Volume 11, No. 7, December, 1968, on Page 864 discloses a masking technique for fabricating semiconductor devices wherein the use of multi-level dielectrics having different etching characteristics can serve as an etching mask for subsequent layers.

Although many techniques are known for producing either fixed threshold or variable threshold devices, attempts to fabricate monolithic inetgrated circuit arrays having both variable threshold devices and fixed threshold devices in the same array have revealed many problems not encountered in producing fixed threshold devices. Because of the high voltages necessary to write a variable threshold device, the processing technique and fabrication steps used to produce the variable threshold device become critical and problems such as dielectric breakdown, surface leakage, and the like, are more profound.

Heretofore because of these problems, the production of variable threshold devices with fixed threshold devices in the same integrated structure was not considered feasable and no satisfactory process was developed.

SUMMARY OF THE INVENTION

It is, therefore an object of the present invention to provide a simple, novel method of producing on the same semiconductor body both fixed threshold and variable threshold field effect transistors of the highest quality.

It is another object of the present invention to describe a process for producing in the same semiconductor body, adjacent fixed and variable threshold devices which process requires but a single critical mask to define all devices to be subsequently fabricated within the array.

It is another object of the invention to describe a process wherein multilevel dielectrics having different etching characteristics can be used as an etching mask for all subsequent processing steps and as the basis for the devices to be produced ultimately therein.

It is a further object of the invention to set forth a method and process for simultaneously fabricating both fixed and variable threshold devices in the same semiconductor wafer. The process comprises the steps of depositing on a wafer a series of layers each having a different etch ratio placing a dimensional mask on said layers, etching through the mask to remove selected areas of said layers thereby defining all the devices to be ultimately produced in the wafer, removing the dimensional mask and alternately applying a series of nondimensional masks on the layers and selectively etching the remaining layers and diffusing impurities in the body to define in the semiconductor wafer a field effect transistor that has either a fixed threshold or a variable threshold.

It is still another object of the present invention to describe a highly reproducible process wherein the use of multi-layer dielectrics with different etch techniques can be laid down in a series on the surface of a semiconductor body to assure alignment by a single step of all subsequent devices to be produced in the body.

These and other aspects of the invention will become more apparent from a consideration of the following detailed description taken in conjunction with the following drawings wherein:

DESCRIPTION OF THE EMBODIMENT

Figure 1A:
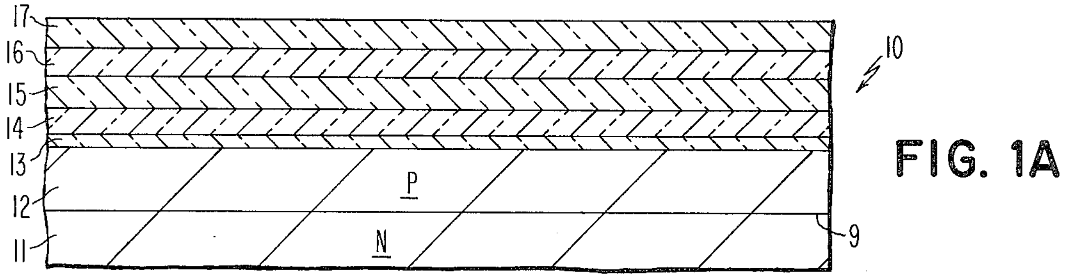
FIGS. 1A through 1K are a schematic sequential representation of the steps used to form in the one semiconductor body both fixed and variable threshold Field Effect transistor.

A specific sequence of steps forming in the same semiconductor body with the same process both fixed and variable threshold transistors is shown in FIGS. 1A through 1K. Referring now, in particular to FIG. 1A, there is shown a body 10, in which the devices are to be formed. This body 10 comprises a substrate 11 formed of 10 to 20 ohm cm type silicon having deposited thereon a 6 micron thick layer 12 of 2 ohm centimeter P type epitaxial silicon. If desired, the epitaxial layer 12 is then cleaned and polished by dipping the wafer in a buffered HF solution of Hydrofluoric acid. Once the surface of layer 12 has been cleaned and polished, a silicon dioxide layer 13, having a thickness of between 40 to 70 angstroms is formed on the surface of layer 12 by the well-known thermal oxidation process.

Once the silicon dioxide layer 13 has been thermally formed on the surface of the epitaxial layer 12, a 600 angstrom thick layer 14 of aluminum trioxide ($Al_2O_3$) commonly known as alumina, is formed on the surface of layer 13 by a chemical vapor deposition reaction. A preferred process for producing this layer of alumina comprises heating the oxidized wafer on a silicon carbidecoated graphite susceptor to a temperature of 900°C and passing over it a heated and gaseous stream of hydrogen, water vapor and carbon dioxide saturated with aluminum trichloride ($Al Cl_3$). This stream of gas is heated at between 110° and 130°C. This process produces, in approximately twenty minutes, a 600 angstrom thick layer 14 of alumina, on the oxide layer 13. The alumina thus produced has the following typical values:

Refractive index—1.72

Dielectric breakdown—$7.0 \times 10^6$ volts per centimeter

Resistivity—$10^{11}$ ohm centimeter at $5 \times 10^6$ volts per centimeter

Relative dielectric constant—9.0

Once the layer 14 of alumina has been formed, a 700 angstrom thick layer 15 of silicon dioxide is then deposited on the surface of layer 14 by a well-known oxide pyrolytic process. Once the layer 15 has entirely coated the layer 14 with a uniform layer of silicon dioxide, a second layer, 16, of alumina, also 600 angstroms in thickness, is formed over the layer 15 by the identical chemical vapor deposition reaction process described above. Following the creation of the second layer 16 of alumina, a third layer of silicon dioxide, 17, 700 angstroms in thickness, is deposited on the surface of alumina layer 16.

Figure 1B:
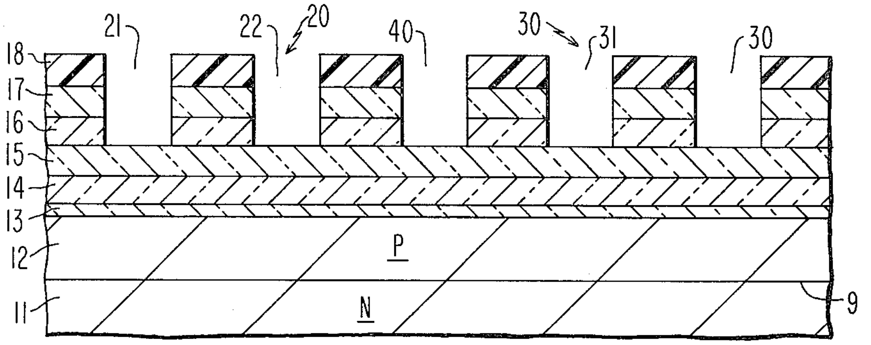

Once the sequential layers 13 through 16 have been deposited on the surface of the body 10, a photo-resist coating 18, shown in FIG. 1B, is placed over the uppermost surface of silicon dioxide layer 17. Then utilizing the standard photo-resist technology and appropriate masking, all source, drain, and isolation openings of each device to be ultimately formed in the array are defined and opened in this photo-resist coating 18. For purposes of illustration only, two devices, 20 and 30, isolated from each other by an isolation region will be described as being formed in the body 10. Device 20 will be formed as a standard fixed threshold device and device 30 will be formed as a variable threshold device.

Device 20 is defined in mask 18 by two openings, 21 and 22. Opening 21 defines the source of the device and opening 22, the drain. Similarly, the variable threshold device, 30, is defined by two openings, 31 and 32 in the same photo-resist layer, 18. Opening 31 defines the source of the device 30 and opening 32 defines the drain. In layer 18, between the two devices, there is provided an opening 40 so that the devices 20 and 30 can be isolated from one another by a suitable isolation diffusion. Once all the source, drain and isolation openings have been defined and opened in the photo-resist layer, 18, they are extended into the uppermost silicon dioxide layer 17 by subjecting the body 10 to a buffered hydrofluoric acid etch, as is well-known to the semiconductor art. This acid etch removes only those portions of layer 17 which are exposed through the windows 21, 22, 31, 32, and 40. However, the hydrofluoric acid solution does not attack the underlying alumina layer, 16, and thus the etching caused by the hydrofluoric acid, is terminated when the surface of the alumina layer 16 is reached. The openings, 21, 22, 31, 32, and 40, are thus extended through layer 17. The photoresist layer 18 is removed by placing the device in the usual commercial stripper. These openings are now further extended through layer 16 by using a hot phosphoric acid solution which will attack the underlying alumina layer 16 which has been exposed by the extending of the openings 21, 22, 31, 32, and 40, through the overlying silicon dioxide layer. The silicon dioxide layer 17 is in itself the barrier to the etching action of the hot phosphoric solution. Because of the protective action of the over lying silicon dioxide layer 17, the phosphoric acid solution will attack the $Al_2O_3$ layer 16 only where it has been exposed by the removal of the $SiO_2$ layer 17 in the openings 21, 22, 31, 32, and 40. After the layers 16 and 17 have had the openings 21, 22, 31, 32 and 40 extended therein and before the devices 20 and 30 are further defined, it is necessary to provide an isolation between the two devices. To this end a non-critical, non-defining blocking mask 45 is placed everywhere over the surface of the device 10 except in the vicinity of the opening 40. Because of the multiple layers 13 through 17, the disposition of this blocking mask 45 is not critical and it need not exactly define the opening 40 as previously defined by the original photoresist layer 18.

Figure 1C:
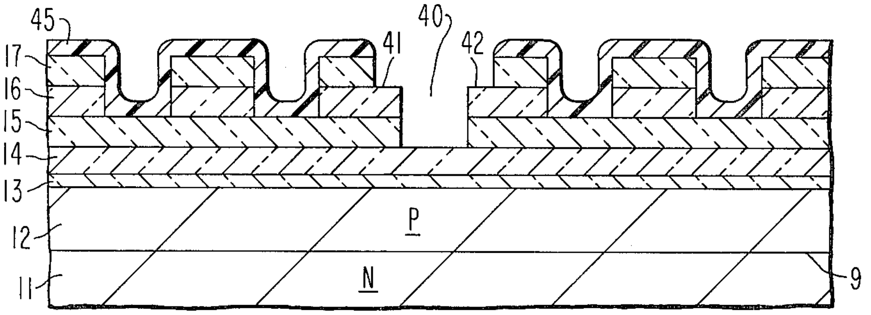
Figure 1D:
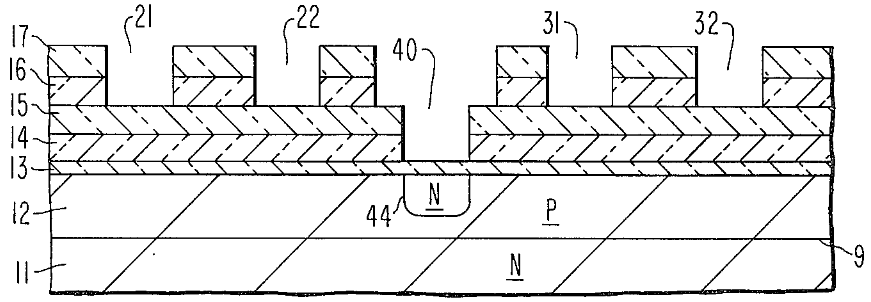

Following the deposition of this non-critical, non-defining blocking mask 45, it is again subjected to an etching solution of buffered hydrofluoric acid. This acid solution dissolves away the layer 15 in the region of opening 40. However, because this buffered hydrofluoric acid will simultaneously attack any exposed silicon dioxide layer, those portions of layer 17 on either side of opening 40 which are exposed by mask 45 are also removed in the opening 40. However, because the layer 16 is not subject to the etching action of the buffered hydrofluoric acid, the portion of opening 40 extended through layer 15 remains the size of the opening previously extended through the mask 18. The mask 45 is now removed by using the standard photoresist removal process described above. Once the window 40 has been extended by etching through layer 15, the device is again subjected to an etching solution consisting of hot phosphoric acid. This hot phosphoric acid solution will dissolve away the under lying alumina layer 14 to extend the opening 40 to the surface of layer 13, as shown in FIG. 1D. Thus, because as shown in FIG. 1C the enlarged opening 40 has exposed shoulders 41 and 42 of layer 16, these exposed shoulders are also removed and the enlarged opening 40 extends to the surface of layer 15 while the original opening 40 has now extended to the surface of layer 13.

Once the original opening 40 has been extended all the way to the surface of the thin silicon dioxide layer 13, the device is now ready for the isolation diffusion step. To this end, a pocket 44 of N- type material is diffused into the epitaxial layer 12 through the opening 40. The process used to provide this pocket is any one of several well-known diffusion processes and the impurities utilized would in this case be, for example, phosphorus or arsenic or any other acceptable N- type impurity. The impurity concentration of the diffusion into the pocket 44 in the exposed window region is preferably about $1 \times 10^{20}$ impurity atoms per cubic centimeter. Although openings 21, 22, 31, and 32 extends through layers 17 and 16, the silicon dioxide layers 15 which has not been removed in these openings blocks the diffusion of the doping materials, thus no N-type impurity will reach the underlying semiconductor body under these openings. The silicon dioxide layer 13 being extremely thin, does not impede the diffusion of the material into pocket 44.

Figure 1E:
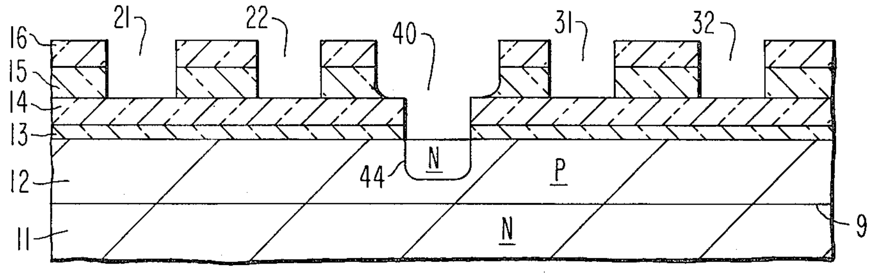
Figure 1F:
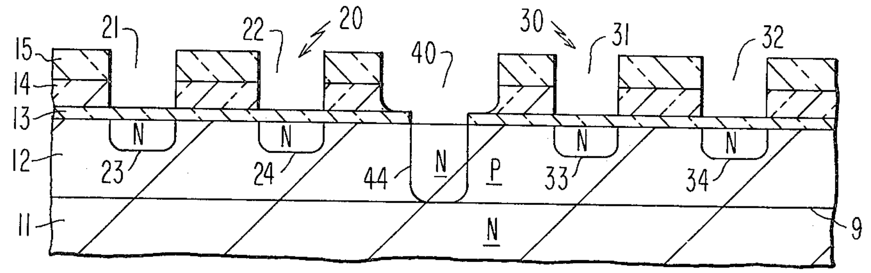

Preferably, the depth of diffusion pocket 44 is such that any subsequent diffusion will cause the pocket 44 to drive in further through the layer 12 and penetrate through the junction 9, extending between the substrate 11 and the epitaxial 12. Following the diffusion of isolation pocket 44, the entire body shown in FIG. 1D is dipped into a solution of buffered hydrofluoric acid. This solution removes all the remainder of oxide layer 17 and simultaneously removes those portions of layer 15 exposed by the openings 21, 22, 31 and 32. This solution will also remove that portion of layer 13 exposed in opening 40 unless that opening has been protected by a suitable blocking mask, as shown in FIG. 1E. Following this step, the body is again subjected to hot phosphorus acid solution to remove the portion of layer 14 exposed by windows 21, 22, 31 and 32. This solution of hot phosphorus acid also removes the remaining portions of layer 16. The structure following this step is shown in FIG. 1F. AS indicated in this figure, the source drain openings 21, 22, 31 and 32 now have been extended to the surface of thin layer of silicon dioxide 13, which remains within the opening 21, 22, 31 and 32. However, as previously indicated because of the thiness of this layer 13, it is not necessary that it be removed since the diffusion can occur through it.

Once the openings 21, 22, 31 and 32 have been extended to at least the surface of layer 13, the body can be again subjected to a diffusion and as shown in 1F, source diffusions 23 and 33, drain diffusions 24, 34 of the two devices 20 and 30 respectively can now be created. These diffusions also use N- type impurities.

It should be noted at this time that while these source and drain diffusions are taking place the previously formed isolation diffusion 44 is being driven further into the layer 12. That is, it is extended further into the layer 12 to ultimately penetrate the junction 9 between the epitaxial layer 12 and the substrate region 11, to assure that both devices 20 and 30 are completely isolated from another. The source and drain diffusions and the isolation diffusion processes are conventional.

Preferably, the resistivity of the diffusion source and drain regions 23, 24, 33, and 34 is approximately 15 ohms per square. It should also be known that with the diffusion step the remaining portions of layer 15 also become diffused with doping material.

Figure 1G:
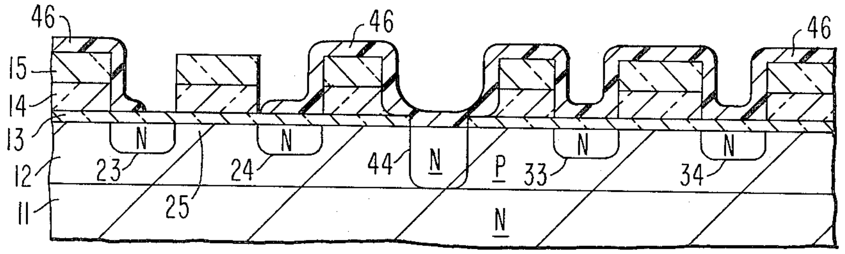
Figure 1H:
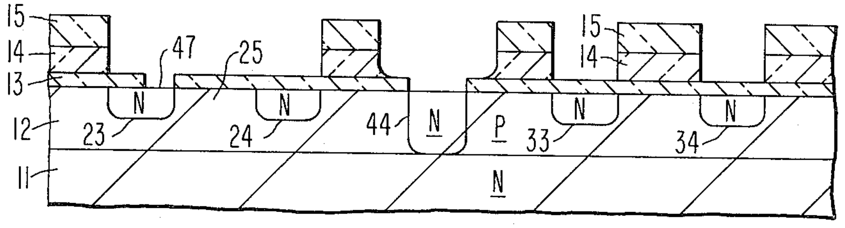
Figure 1I:
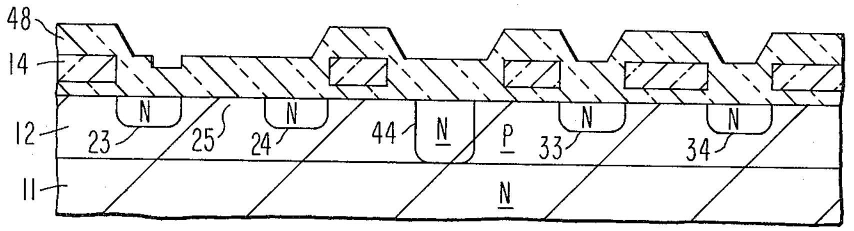
Figure 1J:
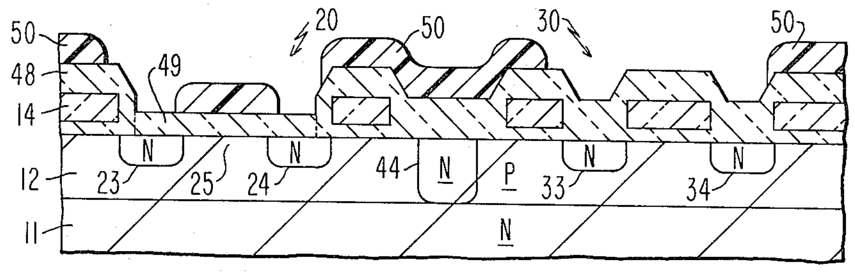

As previously noted, the device 20 was to be made as a fixed threshold device. Consequently, once the source and drain diffusions steps have been completed. A photoresist layer, 46 is again applied to the surface of the device as shown in FIG. 1G such that only the gate region 25 existing between the defined source diffusion 23, and the defined drain diffusion 24 of device 20 is exposed. The photoresist coated body shown in FIG. 1G is subjected to both the buffered hydrofluoric acid etching and the hot phosphorus acid soltion to remove the portions of both layers 14 and 15 exposed by the mask 46 between the silicon drain openings 21 and 22 respectively. It should be noted that the positioning of this mask 46 as shown in FIG. 1G is not critical so long as the entire gate region 25 between the two openings is not covered by the photoresist. Thus, for example, this mask is shown misaligned in FIG. 1G to emphasize this point. The structure resulting from the etching step above is described in FIG. 1H. It is to be noted in FIG. 1H that a slight opening 47 has been made in the silicon dioxide layer 13 over the source diffusion 23 because of misalignment of mask 46.

Following the removal of the $Al_2O_3$ layer 14 in the area overlying the gate region 25 between the source and drain diffusion 23, and 24 of device 20, and 8,000 angstrom thick layer of pyrolytic silicon dioxide is deposited on the surface of the body by means of a suitable or chemical vapor deposition reaction. This layer 48 merges with the previously existing oxide layer 15 and with the layer 13 where it had been exposed by removal of the $Al_2O_3$ layer 14. For clarity of description both the previously deposited layer 15 and the newly deposited pyrolytic silicon layer is shown as a single layer 48. Following the growth of this pyrolytic layer, a non-critical, non-defining blocking mask of photoresist layer is applied to the wafer surface. This pyrolytic layer is removed from over the gate region 25 of device 20. Once again the device is subjected to a reoxidation step to form a thin oxide layer 49, 500 to 1,000 angstroms in thickness over the gate region 25. Following the growth of layer 49 a non-critical, non-defining blocking mask of photoresist 50 is applied to the wafer surface and appropriate openings made there in over the source 23 and the drain 24 of device 20. The mask 50 is also opened over the entire region of the device 30 as is shown in 1J. Following the creation of the blocking mask 50, the devices again are subjected to a buffered hydrofluoric acid solution to remove the silicon dioxide in those regions exposed by mask 50. Once the devices are suitably etched, the photoresist blocking 50 is also removed. It should be noted that in the gate region of device 30 the thick layer of silicon dioxide 48 has been removed to expose the original alumina layer 14 in the gate region between the source 33 and the drain 34 of the device 30. Again it should be noted that the alignment of blocking mask 50 is not critical since the etching away of the over-lying silicon layer will be stopped by those islands of alumina 14 left within the thick silicon dioxide layer 48.

Following this etching step of the device, aluminum or other suitable metal, can be deposited on the surface of the wafer and by using traditional, appropriate, conventional, subtractive etch techniques the final metalization pattern of the device will be defined. Thus, the final structure is contemplated by the present invention as shown in FIG. 1K.

Thus device 20 is a conventional fixed threshold field effect transistor, while device 30 is a variable threshold field effect transistor both created in the same epitaxial layer and separated one from another by isolation diffusion.

Figure 1K:
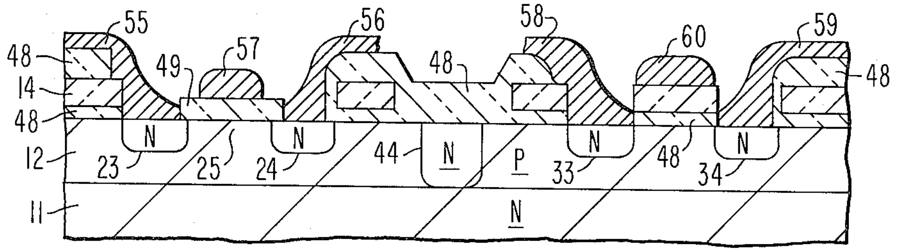

The device structure shown in FIG. 1K thus incorporates both a fixed and a variable threshold device. Overlying the uppermost surfaces of the device is a series of metalic electrodes 55, 56, 57, 58, 59, and 60. Electrode 55 contacts the source diffusion 23 of device 20 while electrode 56 contacts the drain diffusion 24. The electrode 57 serves as the gate electrode for the fixed threshold devices 20. Electrode 58 contacts the source diffusion 33, electrode 59 contacts the drain diffusion 34 of the variable threshold device 30 while electrode 60 serves as its gate contact. Thus there has been described a novel process in which a fabrication problem relating to the formation of both fixed and variable threshold devices in a single semiconductor body without critical alignment of masking between sequential steps has been satisfactorily resolved without the utilization of critical masks.

It should be understood that although the invention has been described using particular resistivities, conductivities, materials, etching solutions, times and temperatures, the utilizations of other suitable process steps and materials, well known to those skilled in the art, could be utilized.

While the invention has been particularly shown and described with referenced figures, it should be understood by those skilled in the art that various changes in form and details of the apparatus and processing to produce a single semiconductor device having therein both fixed and variable threshold devices can be made without departing from the spirit and scope of the invention and that the method is in no way restricted by the devices so involved.

What is claimed is:

1. A method of fabricating a variable threshold field effect transistor having source drain and gate regions and a fixed threshold field effect transistor having source, drain, and gate regions in the same semiconductor body with an isolation region between the devices comprising the steps of depositing on the semiconductor body a series of insulating layers, adjacent layers having different etch ratios, depositing a first mask on said layers which defines the source, drain, and gate regions of both a fixed threshold field effect transistor and a variable threshold field effect transistor, selectively etching selected ones of said layers through said mask to delineate the source, drain, and gate regions of the transistors defined by said mask in said selected layers to selectively expose surface portions of the body, selectively introducing impurities into the exposed surface portions of the body to create separated diffusions in the body, masking the gate region of the variable threshold transistor, selectively removing the insulating layers in the gate region of the fixed threshold transistor, growing a gate oxide in the gate region of the fixed threshold transistor, and forming electrodes on said diffusions and over the gate regions of said fixed threshold and variable threshold transistors.

2. The method of claim 1 which additionally includes the step of forming a diffused isolation region between said fixed threshold field effect transistor and said variable threshold field effect transistor.

3. The method of claim 2 wherein the isolation region is formed by selectively exposing a surface portion of the body between the delineated transistors and diffusing an impurity into said body to form a rectifying junction between said delineated transistors.

4. The method of claim 3 where there is additionally provided a step of forming a thick pyrolytic oxide over said isolation regions.

5. The method of claim 1 wherein said series of insulating layers comprises a first layer of silicon dioxide on the surface of the semiconductor body coated with alternating layers of aluminum trioxide and silicon dioxide.

6. The method of claim 5 wherein said layers of aluminum trioxide are formed by a chemical vapor deposition process.

7. The method of claim 6 wherein said aluminum trioxide has a resistivity of about $10^{11}$ ohm centimeters at $5 \times 10^6$ volts per centimeter and a dielectric breakdown of $7 \times 10^6$ volts per centimeter.

8. A method of fabricating variable threshold field effect transistors having source, drain, and gate regions and fixed threshold field effect transistors having source, drain, and gate regions in the same semiconductor body with an isolation region between the fixed threshold transistors and the variable threshold transistors comprising the steps of growing an epitaxial layer of a first conductivity type upon the surface of a substrate consisting of a semiconductor body of a second and opposite conductivity type, forming a first silicon oxide layer of less than 100 Angstroms in thickness on the surface of said epitaxial layer, depositing a layer of aluminum trioxide of less than 1000 Angstroms in thickness on the surface of said first silicon oxide layer, coating said layer of aluminum trioxide with alternating layers of materials each of which has an etching characteristic different from the etching characteristic of an adjacent layer, delineating the source, drain, and gate regions of both fixed threshold field effect transistors and variable threshold field effect transistors and an isolation region therebetween with a first mask, etching an isolation defining opening and source and drain openings in the uppermost of said alternating layers, through said first mask, masking said source and drain openings, extending said isolation defining opening through said aluminum trioxide layer to said first silicon oxide layer, selectively diffusing through said isolation defining opening an impurity of said second conductivity type to form a diffused isolation region in said epitaxial layer between said delineated fixed threshold transistors and said variable threshold transistors, extending said source and drain openings through said aluminum trioxide layer to at least said first silicon oxide layer, selectively diffusing through said source and drain openings an impurity of said second conductivity type to form diffused source and drain regions for said fixed threshold transistors and said variable threshold transistors in said epitaxial layer, masking said silicon oxide layer and said aluminum trioxide layer in the gate regions of said variable threshold transistors, removing said aluminum trioxide layer over the gate regions of said fixed threshold transistors, forming a second silicon oxide layer over the gate regions of said fixed threshold transistors, and forming metallic, source, drain and gate electrodes on said fixed threshold and said variable threshold devices.

9. The method of claim 8 wherein isolation region is extended through said epitaxial layer to said body by the step of diffusing the source and drain region impurities into said epitaxial layer.

10. The method claim 9 which additionally includes the step of forming a thick pyrolytic oxide over said isolation region and between all of said transistors to eliminate any parasitic transistor action.

* * * * *